(12) United States Patent
Fuhrmann

(10) Patent No.: US 9,666,738 B2
(45) Date of Patent: May 30, 2017

(54) SEMIFINISHED PRODUCT OF A MULTI-JUNCTION SOLAR CELL AND METHOD FOR PRODUCING A MULTI-JUNCTION SOLAR CELL

(71) Applicant: AZUR SPACE Solar Power GmbH, Heilbronn (DE)

(72) Inventor: Daniel Fuhrmann, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 220 days.

(21) Appl. No.: 14/336,565

(22) Filed: Jul. 21, 2014

(65) Prior Publication Data

US 2014/0326300 A1 Nov. 6, 2014

Related U.S. Application Data

(63) Continuation of application No. PCT/EP2013/000096, filed on Jan. 14, 2013.

(30) Foreign Application Priority Data

Jan. 20, 2012 (EP) .................................. 12000386

(51) Int. Cl.
| | |
|---|---|
| *H01L 31/044* | (2014.01) |
| *H01L 31/0352* | (2006.01) |
| *H01L 31/18* | (2006.01) |
| *H01L 31/0687* | (2012.01) |
| *H01L 31/0725* | (2012.01) |

(52) U.S. Cl.
CPC .... *H01L 31/03529* (2013.01); *H01L 31/0687* (2013.01); *H01L 31/0725* (2013.01); *H01L 31/184* (2013.01); *H01L 31/1808* (2013.01); *H01L 31/1892* (2013.01); *Y02E 10/544* (2013.01); *Y02P 70/521* (2015.11)

(58) Field of Classification Search
CPC ........ H01L 31/00–31/078; Y02E 10/50–10/60
USPC .................................................... 136/243–265
See application file for complete search history.

(56) References Cited

U.S. PATENT DOCUMENTS

| | | |
|---|---|---|
| 4,774,194 A | 9/1988 | Hokuyou |
| 4,883,561 A | 11/1989 | Gmitter et al. |
| 5,374,564 A | 12/1994 | Bruel |

(Continued)

FOREIGN PATENT DOCUMENTS

| | | |
|---|---|---|
| DE | 196 49 594 A1 | 6/1998 |
| DE | 10 2008 019 268 A1 | 9/2009 |

(Continued)

*Primary Examiner* — Bach Dinh
(74) *Attorney, Agent, or Firm* — Muncy, Geissler, Olds & Lowe, P.C.

(57) ABSTRACT

A semifinished product of a multi-junction solar cell includes a first semiconductor body that is designed as a first partial solar cell and has a first band gap, a second semiconductor body that is designed as a second partial solar cell and has a second band gap. The first semiconductor body and the second semiconductor body form a bonded connection to a tunnel diode and the first band gap is different from the second band gap. A first substrate material is adapted as a substrate layer, wherein a sacrificial layer is formed between the first substrate material and the first partial solar cell and the first substrate material is removed from the first semiconductor body, the sacrificial layer being destroyed in the process.

16 Claims, 1 Drawing Sheet

(56) References Cited

U.S. PATENT DOCUMENTS

| | | | |
|---|---|---|---|
| 6,071,795 A | 6/2000 | Cheung et al. | |
| 6,211,950 B1 | 4/2001 | Walter | |
| 6,861,335 B2 | 3/2005 | Ueda | |
| 7,785,989 B2 | 8/2010 | Sharps et al. | |
| 7,964,890 B2 | 6/2011 | Ploessl et al. | |
| 8,711,893 B2 | 4/2014 | Avramescu et al. | |
| 2003/0089906 A1 | 5/2003 | Ueda | |
| 2007/0193622 A1 | 8/2007 | Sai | |
| 2008/0128023 A1* | 6/2008 | Arianpour | H01L 31/02168 |
| | | | 136/261 |
| 2009/0229659 A1* | 9/2009 | Wanlass | H01L 31/0725 |
| | | | 136/255 |
| 2010/0116784 A1 | 5/2010 | Archer | |
| 2011/0155231 A1 | 6/2011 | Chen | |
| 2011/0215352 A1* | 9/2011 | Jeong | H01L 33/0079 |
| | | | 257/94 |

FOREIGN PATENT DOCUMENTS

| | | |
|---|---|---|
| FR | 2 954 002 A1 | 6/2011 |
| JP | 2003-218470 A | 7/2003 |
| JP | 2007-103936 A | 4/2007 |
| WO | WO 2004/054003 A1 | 6/2004 |
| WO | WO 2011/008427 A1 | 1/2011 |
| WO | WO 2011/073716 A1 | 6/2011 |
| WO | WO 2011/074156 A1 | 6/2011 |

\* cited by examiner

SEMIFINISHED PRODUCT OF A MULTI-JUNCTION SOLAR CELL AND METHOD FOR PRODUCING A MULTI-JUNCTION SOLAR CELL

This nonprovisional application is a continuation of International Application No. PCT/EP2013/000096, which was filed on Jan. 14, 2013, and which claims priority to European Patent Application No. 12000386.8, which was filed in Europe on Jan. 20, 2012, and which are both herein incorporated by reference.

BACKGROUND OF THE INVENTION

Field of the Invention

The invention relates to a semifinished product of a multi-junction solar cell and a method for producing a solar cell.

Description of the Background Art

U.S. Pat. No. 4,744,194 discloses a method for removing III-V based solar cell layers from a supporting substrate by means of selective chemical etching processes. In addition, methods for separating semiconductor layers from their substrates based on chemical etching processes are known from U.S. Pat. No. 4,883,561 and US 2010/0116784 A1. The separation of semiconductor layers by means of the ion implantation method is known from U.S. Pat. No. 5,374,564. Furthermore, optical methods for separation of semiconductor materials, in particular separation of LED layers based on group III nitrides from substrates with large band gaps, are known from DE 196 49 594 A1, which corresponds to U.S. Pat. No. 6,211,950, and from U.S. Pat. No. 6,071,795. Additionally, another solar cell structure is known from U.S. Pat. No. 7,785,989 B2.

SUMMARY OF THE INVENTION

It is therefore an object of the invention is to provide a device that advances the state of the art.

Provided according to an embodiment of the invention is a semifinished product of a multi-junction solar cell comprising a semiconductor body that is designed as a first partial solar cell and has a first band gap, comprising a semiconductor body that is designed as a second partial solar cell and has a second band gap, wherein the first semiconductor body and the second semiconductor body form a material-to-material connection with a tunnel diode, and the first band gap is different from the second band gap, and comprising a first substrate material implemented as a substrate layer, wherein a sacrificial layer is formed between the first substrate material and the first partial solar cell, and the first substrate material is removed from the first semiconductor body with the destruction of the sacrificial layer. It should be noted that the two partial solar cells are arranged in a stack and that a partial solar cell refers to a semiconductor body that generates electrical energy by direct conversion from the energy of incident photons of a certain region of the solar spectrum. The sensitivity regions of the partial solar cells are chosen such that all partial solar cells together utilize the solar spectrum in a maximally ideal fashion. Conversion efficiencies of up to 40% can be achieved today using the concept of stacked multi-junction solar cells. Moreover, it should be noted that preferably only the sacrificial layer is destroyed during separation from the substrate.

Provided according to an embodiment of the invention is a method for producing a multi-junction solar cell comprising a first substrate material implemented as a substrate layer, wherein a semiconductor body is produced that is designed as a first partial solar cell and has a first band gap, and a semiconductor body is produced that is designed as a second partial solar cell and has a second band gap, wherein a material-to-material connection with a tunnel diode is formed between the first semiconductor body and the second semiconductor body, and the first band gap is different from the second band gap, wherein a sacrificial layer is formed between the first substrate material and the first partial solar cell, and in a subsequent process step the first substrate material is removed from the first semiconductor body with the destruction of the sacrificial layer.

An advantage of the sacrificial layer on the substrate is that the stacked multi-junction solar cell can be removed from the substrate in a simple and cost-effective manner. The multi-junction solar cell can be separated from the substrate by means of the separation process without damaging either the substrate or the multi-junction solar cell. It is advantageous to remove any residues of the sacrificial layer on the substrate or first partial solar cell by means of a cleaning process after the separation. Moreover, it is advantageous that additional partial solar cells can be applied to the multi-junction solar cell after removal from the substrate layer, and by this means high-efficiency multi-junction solar cells having a stack of 3, 4, or more partial solar cells can be produced. The term "high-efficiency solar cells" is understood to mean solar cells that have a conversion coefficient above 25%.

The stacked multi-junction solar cell can be implemented as a III-V solar cell, which is to say as a solar cell having compound semiconductors from the $3^{rd}$ and $5^{th}$ major groups of the periodic table. Furthermore, the substrate can be reused for producing multi-junction solar cells. Because the substrates are very cost-intensive, production costs can be sharply reduced through reuse of the substrates. Another advantage of the novel separation technique is that the removal can now be performed very quickly and reliably. Investigations have shown that the novel method and the novel structure can be used to particular advantage on multi-junction solar cells for space flight applications, which have a typical size of 8 cm×4 cm or larger. In addition, it is also advantageous to use the novel removal process for producing multi-junction solar cells whose size is less than 8 cm×4 cm, preferably in a range from 1 mm$^2$ to 400 mm$^2$. Multi-junction solar cells of this type with a small size can be used by preference in terrestrial concentrator systems.

The sacrificial layer can be implemented such that the sacrificial layer can be locally heated with the absorption of electromagnetic energy. The substrate can be separated easily from the solar cell stack by means of the thermal decomposition of the sacrificial layer that thus occurs. By this means, throughput and yield in production are increased, and production costs are reduced.

For thermally induced decomposition of the sacrificial layer resulting from the absorption of electromagnetic radiation, the sacrificial layer can have a band gap with an energy of less than 1.5 eV, most preferably less than 1.2 eV. As a result, the sacrificial layer is not transparent to visible light, and has an absorption band in the infrared spectral region. It is ideal but not mandatory for the sacrificial layer to have the smallest band gap energy of all layers of the stacked multi-junction solar cell. If the other layers of the stacked multi-junction solar cell, which is to say in particular the stack composed of the first semiconductor body and second semiconductor body, are designed to be transparent to the incident electromagnetic radiation, which preferably is in the infrared wavelength region, it is ensured by this means that the electromagnetic energy incident through the stack composed of the first semiconductor body and second semiconductor body is only absorbed in the sacrificial layer. It is advantageous to match the band gap energy of the sacrificial layer and the energy of the incident electromagnetic radiation to one another. Investigations have shown that it is advantageous to match the absorption band of the sacrificial layer to the wavelength of an infrared laser device with a pulsed laser having an energy of approximately 1.16 eV, for example a Nd-YAG laser having a wavelength of 1064 nm. To this end, the band gap energy of the sacrificial layer is set to a value of 1.15 eV.

Investigations have shown that different materials are suitable for the sacrificial layer depending on the type of substrate. Starting from a GaAs substrate, an InP substrate, or a Ge substrate, it is especially advantageous to form the sacrificial layer from InAs, GaAs, InSb, GaSb, InP, or their ternary and quaternary mixed semiconductors. On account of the low band gap of Ge, an epitaxially grown Ge sacrificial layer, in particular, is especially suited to a multi-junction solar cell on a GaAs substrate or an InP substrate. It is advantageous to form the sacrificial layer in a thickness between 10 nm and 200 nm.

In an embodiment, the sacrificial layer can have a lattice constant that is different from the lattice constant of the first partial solar cell. Investigations have shown that it is advantageous for the sacrificial layer to be deposited on the substrate with a lattice mismatch.

In an embodiment, the sacrificial layer can be lattice-matched to the first partial solar cell. In this case, when the sacrificial layer is produced the lattice constant is chosen to be essentially equal to that of the first partial solar cell.

Investigations have shown that it is especially advantageous according to one further development for a buffer layer to be formed between the sacrificial layer and the first partial solar cell, and for the buffer layer to have a material-to-material connection to the first partial solar cell. Especially during removal, the buffer layer acts as an additional protective layer and prevents damage to the first semiconductor body. Investigations have shown that it is advantageous to choose the buffer layer to be lattice-matched, which is to say to choose the lattice constant of the buffer layer to be comparable to the lattice constant of the first partial solar cell. In particular, it is advantageous to choose the thickness of the buffer layer to be between 100 nm and 2 µm; most preferably, the thickness of the buffer layer is chosen to be 500 nm.

According to embodiment, the buffer layer can be implemented as a Bragg reflector. This has the effect that light that is not absorbed in the first semiconductor body is reflected back into the first semiconductor body. In this way, the efficiency of the multi-junction solar cell can be increased.

According to an embodiment, a support layer that has a material-to-material connection to the second partial solar cell can be arranged on the second partial solar cell. Investigations have shown that the support layer mechanically stabilizes the solar cell after removal of the substrate, in particular when at least one additional partial solar cell is applied on the first partial solar cell after removal in order to form a multi-junction solar cell having 3, 4, or more partial solar cells.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
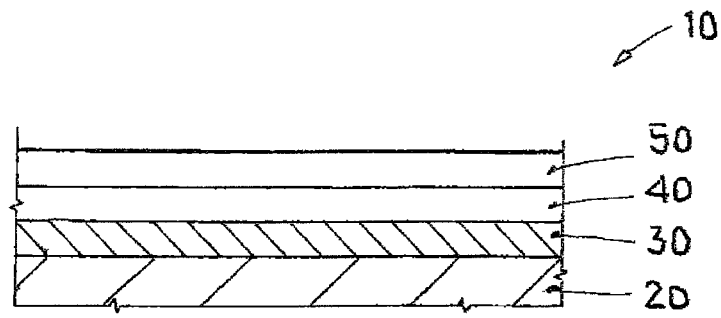
FIGS. 1a-1d show a cross-section of different embodiments and production steps of a semifinished product of a multi-junction solar cell.

The illustration in FIG. 1a shows a schematic cross-section of a semifinished product with a stacked arrangement of a multi-junction solar cell 10, having a substrate layer 20, a sacrificial layer 30, a first semiconductor body 40, and a second semiconductor body 50 with a material-to-material connection to the first semiconductor body 40. A tunnel diode is formed between the first semiconductor body 40 and the second semiconductor body 50. The sacrificial layer is preferably attached to the first semiconductor body 40 lying thereon. The multi-junction solar cell is preferably designed as a III-V solar cell, in particular using InGaAs and InGaP. Furthermore, the first semiconductor body 40 is designed as a first partial solar cell and the second semiconductor body 50 is designed as a second partial solar cell, wherein the first partial solar cell has a first band gap and the second partial solar cell has a second band gap different from the first band gap. Moreover, the sacrificial layer has a third band gap, wherein the third band gap is chosen to be smaller than the first and second band gaps. In addition, the substrate layer having a substrate material with a fourth band gap, wherein the fourth band gap is preferably less than 1.6 eV and preferably larger than the third band gap.

Figure 1B:
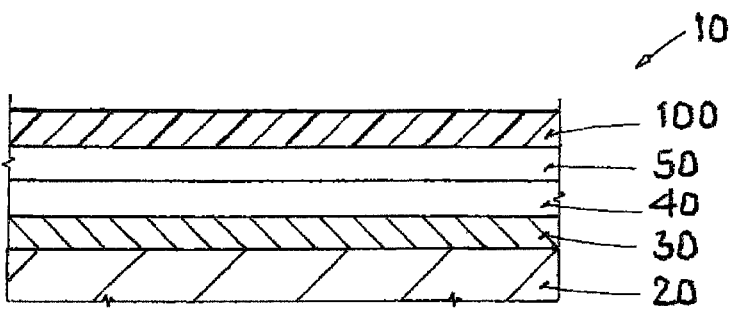

A second embodiment of a semifinished product is shown in the illustration in FIG. 1b. Only the differences from the embodiment shown in the illustration in FIG. 1a are explained below. A support layer 100 is formed on the second semiconductor body 50. The support layer can also be implemented to particular advantage as a plastic film and serves to mechanically stabilize the stack composed of the first and second semiconductor bodies 40 and 50 after removal.

Figure 1C:
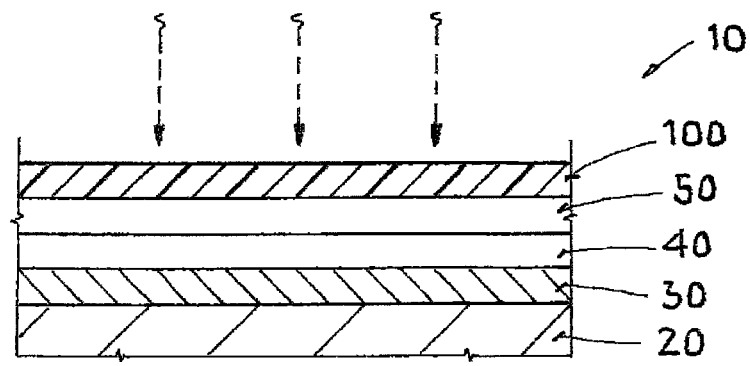

The illustration in FIG. 1c shows a process step that further develops the semifinished product from FIG. 1b. Only the differences from the embodiments shown in one of the preceding figures are explained below. The sacrificial layer is heated and decomposed by means of infrared radiation, preferably by means of an infrared laser. Here, the wavelength of the radiation is matched to the absorption capacity of the sacrificial layer 30. Investigations have shown that irradiation with light takes place through the front side of the multi-junction solar cell, which is to say through the stack composed of the first and second semiconductor bodies 40 and 50, or alternatively through the substrate layer 20. In the case of exposure through the front side, it is advantageous in one embodiment, as shown in FIG. 1c, to apply the support layer 100 even before irradiation if the support layer 100 is transparent to the wavelength of the infrared laser. According to an alternative embodiment, it is advantageous to apply the support layer only after irradiation with infrared light. In this case, exposure of the semifinished product takes place according to the embodiment shown in FIG. 1a, through the front side and/or rear side. The support layer applied after irradiation can then be used, in particular, to lift the multi-junction solar cell off of the substrate 20.

According to a further development, it is especially advantageous to expose the sacrificial layer 30 simultaneously through the front side, which is to say through the semiconductor bodies 40 and 50 with or without the support layer 100, and through the substrate layer 20. The sacrificial layer 30 is intensely heated by the irradiation with light. In this process, the multi-junction solar cell is separated from the substrate 20 with the destruction of the sacrificial layer 30.

Figure 1D:
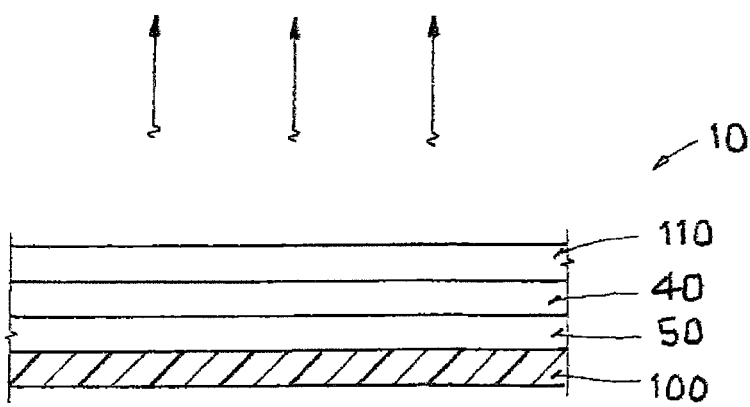

The illustration in FIG. 1d shows a process step that further develops the semifinished product from FIG. 1c. Only the differences from the embodiments shown in one of the preceding figures are explained below. After the complete removal of the sacrificial layer 30, the multi-junction solar cell is turned over and a third semiconductor body 110 is formed on the first semiconductor body 40. It should be noted that the third semiconductor body 110 is also implemented as a III-V compound.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A semifinished product of a multi-junction solar cell comprising:
    a first semiconductor body adapted as a first partial solar cell, the first semiconductor body has a first band gap;
    a second semiconductor body adapted as a second partial solar cell, the second semiconductor body has a second band gap, the first semiconductor body and the second semiconductor body form a material-to-material connection with a tunnel diode, the first band gap being different from the second band gap;
    a first substrate material implemented as a substrate layer; and
    a sacrificial layer formed between the first substrate material and the first partial solar cell,
    wherein the substrate layer is a GaAs or InP or Ge substrate,
    wherein the sacrificial layer has a third band gap,
    wherein the third band gap is smaller than the first band gap and smaller than the second band gap,
    wherein the third band gap is less than 1.2 eV,
    wherein a stack formed of the first semiconductor body and the second semiconductor body is transparent to incident electromagnetic radiation in an infrared wavelength region,
    wherein the stack is irradiated through the first and second semiconductor body and into the sacrificial layer towards the substrate layer,
    wherein the sacrificial layer has an absorption band in an infrared spectral region so that electromagnetic energy incident through the stack is absorbed only in the sacrificial layer in order to remove the first substrate material from the first semiconductor body with the destruction of the sacrificial layer, and
    wherein the sacrificial layer is attached directly to the first semiconductor body.

2. The semifinished product according to claim 1, wherein the sacrificial layer has a lattice constant that is different from the lattice constant of the first partial solar cell.

3. The semifinished product according to claim 1, wherein the sacrificial layer is lattice-matched to the first partial solar cell.

4. The semifinished product according to claim 1, wherein the substrate layer has a band gap with an energy of less than 1.5 eV.

5. The semifinished product according to claim 1, wherein the first partial solar cell has a support layer with a material-to-material connection to the second partial solar cell.

6. The semifinished product according to claim 1, wherein a buffer layer is formed between the sacrificial layer and the first partial solar cell, and wherein the buffer layer has a material-to-material connection to the first partial solar cell.

7. The semifinished product according to claim 6, wherein the buffer layer is a Bragg reflector.

8. The semifinished product according to claim 1, wherein a support layer that has a material-to-material connection to the second partial solar cell is arranged on the second partial solar cell.

9. A method for producing a multi-junction solar cell comprising:
    providing a first substrate material as a substrate layer;
    providing a first semiconductor body that is adapted as a first partial solar cell and that has a first band gap;
    providing a second semiconductor body that is adapted as a second partial solar cell that has a second band gap, the first band gap being different from the second band gap;
    forming a material-to-material connection with a tunnel diode between the first semiconductor body and the second semiconductor body;
    forming a sacrificial layer between the first substrate material and the first partial solar cell;
    forming the substrate layer from a GaAS or InP or Ge substrate;
    forming the sacrificial layer with a third band gap of less than 1.2 eV, the third band gap being smaller than the first band gap and the second band gap;
    forming from the first semiconductor body and the second semiconductor body such that the stack is transparent to incident electromagnetic radiation in an infrared wavelength region;
    irradiating the stack through the first and second semiconductor body and into the sacrificial layer towards the substrate layer, and
    removing the first substrate material from the first semiconductor body via a destruction of the sacrificial layer in that the electromagnetic radiation incident through the stack composed of the first semiconductor body and the second semiconductor body is absorbed in the sacrificial layer;
    wherein the sacrificial layer is attached directly to the first semiconductor body.

10. The method according to claim 9, wherein a buffer layer that has a material-to-material connection to the first partial solar cell is provided between the sacrificial layer and the first partial solar cell.

11. The method according to claim 10, wherein the buffer layer is a Bragg reflector.

12. The method according to claim 10, wherein a support layer has a material-to-material connection to the second partial solar cell and is arranged on the second partial solar cell.

13. The method according to claim 9, wherein the sacrificial layer is heated and decomposed via absorption of an electromagnetic wave, and wherein the first partial solar cell and the second partial solar cell are removed from the sacrificial layer together.

14. The method according to claim 9, wherein an additional single-junction solar cell or an additional multi-junction solar cell is formed on the first partial solar cell or the second partial solar cell, and wherein the additional single-junction solar cell or the additional multi-junction solar cell has a band gap that is different from the first partial solar cell and the second partial solar cell.

15. The semifinished product according to claim 1, wherein the sacrificial layer is formed directly against the first semiconductor body without any intervening layers.

16. The semifinished product according to claim 1, wherein the sacrificial layer is formed on the substrate with a lattice mismatch.

\* \* \* \* \*